United States Patent
Kim et al.

(10) Patent No.: US 7,910,909 B2
(45) Date of Patent: Mar. 22, 2011

(54) NON-VOLATILE MEMORY DEVICE AND METHOD OF FABRICATING THE SAME

(75) Inventors: Suk-pil Kim, Yongin-si (KR);
Yoon-dong Park, Yongin-si (KR);
June-mo Koo, Seoul (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 197 days.

(21) Appl. No.: 12/232,745

(22) Filed: Sep. 23, 2008

(65) Prior Publication Data
US 2009/0261314 A1    Oct. 22, 2009

(30) Foreign Application Priority Data

Apr. 16, 2008  (KR) .................. 10-2008-0035217

(51) Int. Cl.
*H01L 45/00* (2006.01)
(52) U.S. Cl. ............ 257/4; 257/5; 257/E45.002; 438/54
(58) Field of Classification Search .................. 257/2, 3, 257/4, 5, E45.002; 438/54
See application file for complete search history.

(56) References Cited

U.S. PATENT DOCUMENTS

| | | | | |
|---|---|---|---|---|
| 7,767,993 | B2 * | 8/2010 | Toda et al. ...................... 257/2 |
| 2008/0210926 | A1 * | 9/2008 | Lowrey ........................ 257/5 |
| 2009/0321878 | A1 * | 12/2009 | Koo et al. .................. 257/536 |
| 2010/0072452 | A1 * | 3/2010 | Kim et al. ..................... 257/4 |

* cited by examiner

*Primary Examiner* — Jerome Jackson, Jr.
*Assistant Examiner* — Paul A Budd
(74) *Attorney, Agent, or Firm* — Harness, Dickey & Pierce, P.L.C.

(57) ABSTRACT

Provided are a non-volatile memory device that may be configured in a stacked structure and may be more easily highly integrated, and a method of fabricating the non-volatile memory device. At least one first electrode and at least one second electrode are provided. The at least one second electrode may cross the at least one first electrode. At least one data storage layer may be at an intersection between the at least one first electrode and the at least one second electrode. Any one of the at least one first electrode and the at least one second electrode may include at least one junction diode connected to the at least one data storage layer.

18 Claims, 8 Drawing Sheets

NON-VOLATILE MEMORY DEVICE AND METHOD OF FABRICATING THE SAME

PRIORITY STATEMENT

This application claims priority under U.S.C. §119 to Korean Patent Application No. 10-2008-0035217, filed on Apr. 16, 2008, in the Korean Intellectual Property Office (KIPO), the entire contents of which are incorporated herein by reference.

BACKGROUND

1. Field

Example embodiments relate to a semiconductor device, and more particularly, to a non-volatile memory device having a multilayer structure and a method of fabricating the non-volatile memory device.

2. Description of the Related Art

Demands for semiconductor products with smaller volume and higher data processing capacity have increased. To satisfy these demands, the operation speed and the integration degree of non-volatile memory devices used in semiconductor products has to be increased. In this respect, non-volatile memory devices with a multilayer structure, rather than a conventional monolayer structure, are advantageous for higher integration.

When a multilayer structure is used, memory cells may be vertically stacked in a region where a monolayer structure may be formed. However, in a non-volatile memory device having a multilayer structure, connecting memory cells in different layers and selecting memory cells from each layer may be difficult. In addition, in the non-volatile memory device with a multilayer structure, as the number of stacked layers increases, the manufacturing cost may be higher because more manufacturing processes may be required.

SUMMARY

Example embodiments provide a non-volatile memory device applicable for a multilayer structure to have increased integration. Example embodiments also provide an economical method of fabricating the non-volatile memory device.

According to example embodiments, a non-volatile memory device may include at least one first electrode, at least one second electrode crossing the at least one first electrode, and at least one data storage layer at an intersection between the at least one first electrode and the at least one second electrode, wherein any one of the at least one first electrode and the at least one second electrode may include at least one junction diode connected to the at least one data storage layer.

The at least one first electrode may include a semiconductor of a first conductive type, and the at least one junction diode may include a junction structure between the semiconductor and a doped region of a second conductive type opposite to the first conductive type, wherein the doped region may be in the semiconductor. The at least one junction diode may be inside the at least one first electrode so as to be integrated to the at least one first electrode as one body. The at least one second electrode may include at least one pair of second electrodes on both sides of the at least one first electrode.

The at least one first electrode may include a first surface and a second surface facing the at least one pair of second electrodes, and wherein the at least one junction diode may include at least one pair of junction diodes on the first surface and the second surface. The at least one pair of junction diodes may include a plurality of pairs of junction diodes in a direction parallel to a direction in which the at least one first electrode extends. The at least one first electrode may include a plurality of first electrodes stacked in a plurality of layers, and the at least one pair of junction diodes may include a plurality of pairs of junction diodes on the first surface and the second surface of the plurality of first electrodes.

The at least one first electrode may include a plurality of first electrodes, the at least one second electrode may include a plurality of second electrodes, and the at least one junction diodes may include a plurality of junction diodes between the plurality of first electrodes and the plurality of second electrodes.

According to example embodiments, there is provided a method of fabricating a non-volatile memory device. At least one first electrode may be formed. At least one junction diode may be formed in the at least one first electrode. At least one data storage layer may be formed so as to be connected to the at least one junction diode. At least one second electrodes may be formed so as to cross the at least one first electrode. The at least one data storage layer may be at an intersection between the at least one first electrode and the at least one second electrode.

The at least one first electrode may include a semiconductor of a first conductive type, forming the at least one junction diode may include forming at least one doped region of a second conductive type opposite to the first conductive type in the semiconductor. The at least one doped region may be formed by selectively implanting impurities of the second conductive type into the semiconductor.

According to example embodiments, there is provided a method including forming the at least one junction diode, wherein the at least one pair of junction diodes may be formed by tilt ion implantation.

BRIEF DESCRIPTION OF THE DRAWINGS

Example embodiments will be more clearly understood from the following detailed description taken in conjunction with the accompanying drawings.

FIGS. 1-5 are perspective views of a non-volatile memory device according to example embodiments;

FIGS. 6, 8, 10 and 12 are perspective views for explaining a method of fabricating a non-volatile memory device according to example embodiments;

FIG. 7 is a cross-sectional view of the non-volatile memory device of FIG. 6, taken along line VII-VII';

FIG. 9 is a cross-sectional view of the non-volatile memory device of FIG. 8, taken along line IX-IX';

FIG. 11 is a cross-sectional view of the non-volatile memory device taken along a line XI-XI' of FIG. 10;

FIG. 13 is a cross-sectional view of the non-volatile memory device of FIG. 12, taken along line XIII-XIII';

FIG. 14 is a block diagram of a card according to example embodiments; and

FIG. 15 is a block diagram of a system according to example embodiments.

Figure 1:
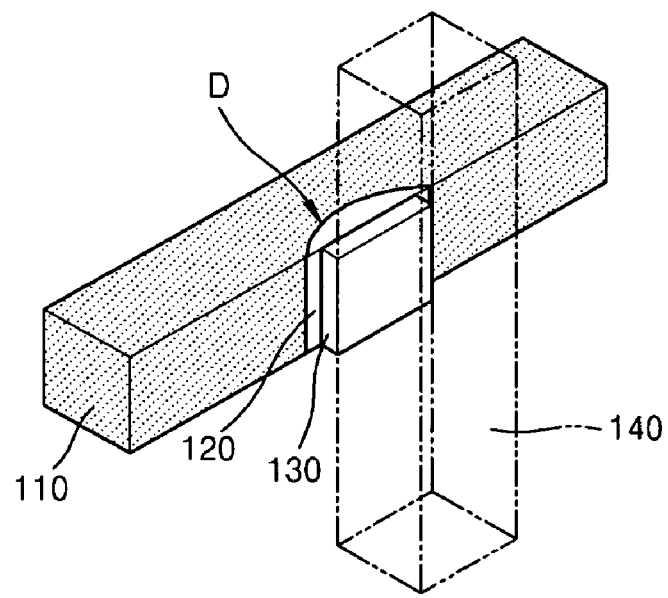
FIGS. 1-15 represent non-limiting, example embodiments as described herein.

It should be noted that these Figures are intended to illustrate the general characteristics of methods, structure and/or materials utilized in certain example embodiments and to supplement the written description provided below. These drawings are not, however, to scale and may not precisely reflect the precise structural or performance characteristics of any given embodiment, and should not be interpreted as defining or limiting the range of values or properties encompassed by example embodiments. For example, the relative thicknesses and positioning of molecules, layers, regions and/ or structural elements may be reduced or exaggerated for clarity. The use of similar or identical reference numbers in the various drawings is intended to indicate the presence of a similar or identical element or feature.

DETAILED DESCRIPTION OF EXAMPLE EMBODIMENTS

Hereinafter, example embodiments will be described in detail by explaining example embodiments with reference to the attached drawings. Example embodiments may, however, be embodied in many different forms and should not be construed as being limited to the embodiments set forth herein; rather, these embodiments are provided so that this disclosure will be thorough and complete, and will fully convey the concept of example embodiments to those of ordinary skill in the art. In the drawings, the sizes of elements are exaggerated for clarity.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. As used herein the term "and/or" includes any and all combinations of one or more of the associated listed items.

It will be understood that, although the terms "first", "second", etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of example embodiments.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Example embodiments are described herein with reference to cross-sectional illustrations that are schematic illustrations of idealized embodiments (and intermediate structures) of example embodiments. As such, variations from the shapes of the illustrations as a result, for example, of manufacturing techniques and/or tolerances, are to be expected. Thus, example embodiments should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of example embodiments.

Unless otherwise defined, all terms (including technical and scientific terms) used herein have the same meaning as commonly understood by one of ordinary skill in the art to which example embodiments belong. It will be further understood that terms, such as those defined in commonly-used dictionaries, should be interpreted as having a meaning that is consistent with their meaning in the context of the relevant art and will not be interpreted in an idealized or overly formal sense unless expressly so defined herein.

FIG. 1 is a perspective view of a non-volatile memory device according to example embodiments. Referring to FIG. 1, a first electrode 110 and a second electrode 140 may be disposed so as to cross each other. For example, the first electrode 110 and the second electrode 140 may be disposed so as to be perpendicular to each other. However, example embodiments may not be limited thereto. For example, the first electrode 110 and the second electrode 140 may be disposed so as to cross each other at a predetermined or given angle.

A data storage layer 130 may be interposed between the first electrode 110 and the second electrode 140. For example, the data storage layer 130 may be interposed at the intersection between the first electrode 110 and the second electrode 140. However, example embodiments may not be limited thereto. As another example, the data storage layer 130 may be disposed as a single layer between the first electrode 110 and the second electrode 140.

The data storage layer 130 may locally store resistance variation thereof, and may control current flow between the first electrode 110 and the second electrode 140. For example, the data storage layer 130 may have higher or lower resistance characteristics, or insulator characteristics according to a voltage applied to the data storage layer 130. The variable resistance characteristics of the data storage layer 130 may be used for the non-volatile memory device to store data.

For example, the data storage layer 130 may include a phase change resistor. In example embodiments, the non-volatile memory device may operate as a phase-change random access memory (PRAM). For example, the phase change resistor may include a chalcogenide compound, for example, $GeSb_xTe_y$ (GST). The phase change resistor may have a higher resistance state and a lower resistance state according to the crystalline state of the phase change resistor.

As another example, the data storage layer 130 may include a variable resistor. In example embodiments, the non-volatile memory device may operate as a resistance random access memory (RRAM). The variable resistor may be different from the phase change resistor in that the resistance of the variable resistor may change without changing the crystalline state of the variable resistor. For example, the variable resistor may include NiO, $Nb_2O_5$ or ZnO. However, the variable resistor may be understood as a broad term that also may include a phase change resistor.

As another example, the data storage layer 130 may include a breakdown material. For example, the data storage layer 130 may include an insulating material (e.g., oxide) in which breakdown may occur according to a voltage applied to the data storage layer 130. The non-volatile memory device may be used as a one-time program (OTP) memory. In spite of this disadvantage of the OTP memory, the OTP memory may be used in a product in which a memory with larger capacity is required. Because the breakdown material may not regain the insulating characteristic, the breakdown material may be referred to as a fuse. On the other hand, the phase change resistor and/or the variable resistor may be referred to as an anti-fuse due to the reversible change in their conductive characteristics.

The first electrode 110 may include a junction diode D connected to the data storage layer 130. The junction diode D may have a function of rectifying current flow between the first electrode 110 and the second electrode 140. For example, the current flow between the first electrode 110 and the second electrode 140 may flow in a direction according to the polarity of junction diode D. For example, the first electrode 110 may include a semiconductor of a first conductive type, and the junction diode D may include a junction structure between the semiconductor of the first conductive type and a doped region 120. The doped region 120 may be of a second conductive type opposite to the first conductive type. For example, when the semiconductor of the first conductive type is an N-type semiconductor, the semiconductor of the second conductive type may be a P-type semiconductor. As another example, when the semiconductor of the first conductive type is a P-type semiconductor, the semiconductor of the second conductive type may be an N-type semiconductor. Thus, the junction diode D may have a PN direct junction structure.

The second electrode 140 may include a conductor and/or a semiconductor. For example, the second electrode 140 may be configured as a semiconductor of a second conductive type so that the second electrode 140 and the doped region 120 may not have a PN junction structure. According to example embodiments, the non-volatile memory device may constitute a single memory cell. For example, when the first electrode 110 is a bit line, the second electrode 140 may be a word line, and vice versa. A signal from the first electrode 110 may be rectified by the junction diode D to be transmitted to the second electrode 140 via the data storage layer 130.

Moreover, the junction diode D may be provided inside the first electrode 110 so as to be integrated thereto as one body. Thus, the configuration of the non-volatile memory device may be simplified and the volume of the non-volatile memory device may be reduced compared to where a separate diode is disposed between the first electrode 110 and the second electrode 140. In addition, because the junction diode D has a PN direct junction structure, the junction diode D may have improved rectification characteristics compared to a P-insulating layer-N junction structure.

Figure 2:
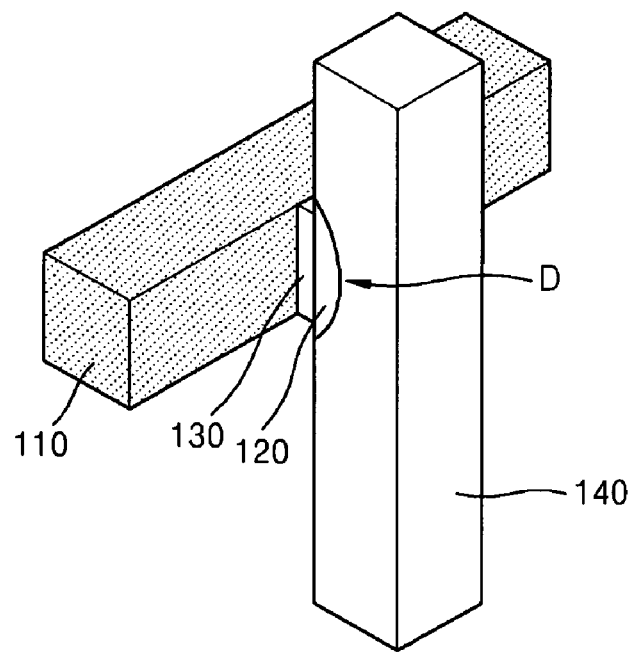

FIG. 2 is a perspective view of a non-volatile memory device according to example embodiments. The non-volatile memory device according to example embodiments illustrated in FIG. 2 is a modified version of the non-volatile memory device of FIG. 1, which will not be described here to avoid repetition. Referring to FIG. 2, a junction diode D may be provided inside the second electrode 140 so as to be integrated thereto as one body unlike in FIG. 1. For example, the second electrode 140 may include a semiconductor having a first conductive type, and the junction diode D may include a junction structure of the semiconductor having the first conductive type and a doped region 120.

Figure 3:
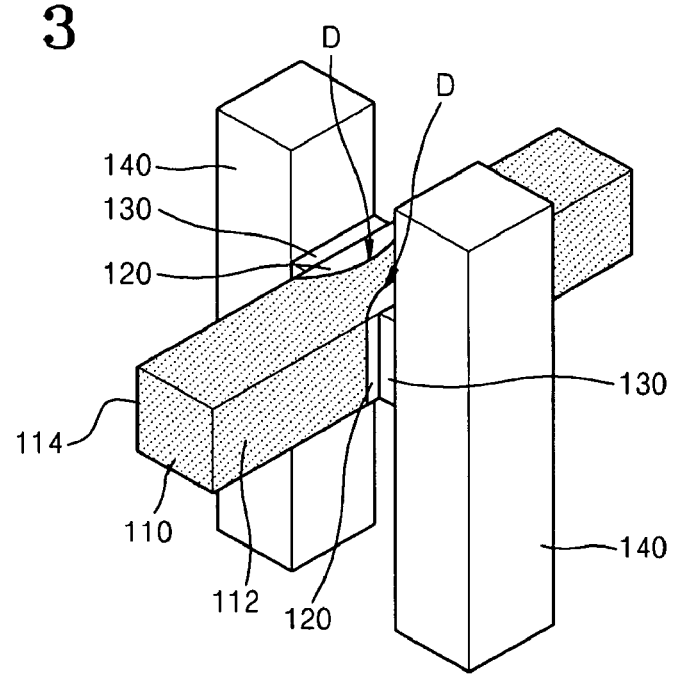

FIG. 3 is a non-volatile memory device according to example embodiments. The non-volatile memory device according to example embodiments illustrated in FIG. 3 is a modified version of the non-volatile memory device of FIG. 1, which will not be described here to avoid repetition. Referring to FIG. 3, a pair of second electrodes 140 may be disposed on both sides of a first electrode 110. For example, the first electrode 110 may include a first surface 112 and a second surface 114 which are opposite to each other, and the second electrodes 140 may each be disposed so as to face the first surface 112 and the second surface 114. The second electrodes 140 may be disposed so as to be perpendicular to the first electrode 110, and/or may be disposed to be parallel to each other. However, example embodiments may not be limited thereto. For example, the second electrodes 140 may not be parallel to each other while crossing the first electrode 110.

A pair of data storage layers 130 may be interposed between the first electrode 110 and the second electrodes 140. A pair of junction diodes D may be disposed inside the first electrode 110 so that each may be connected to the data storage layers 130. For example, the junction diodes D may each be disposed on the first surface 112 and the second surface 114. Doped regions 120 may each be exposed on the first surface 112 and the second surface 114 to be connected to the data storage layers 130. According to example embodiments, the non-volatile memory device may constitute a pair of memory cells. The first electrode 110 may be used as a common bit line, and the second electrodes 140 may be used as word lines. Thus, the non-volatile memory device may process 2-bit data by using the data storage layers 130.

Figure 4:
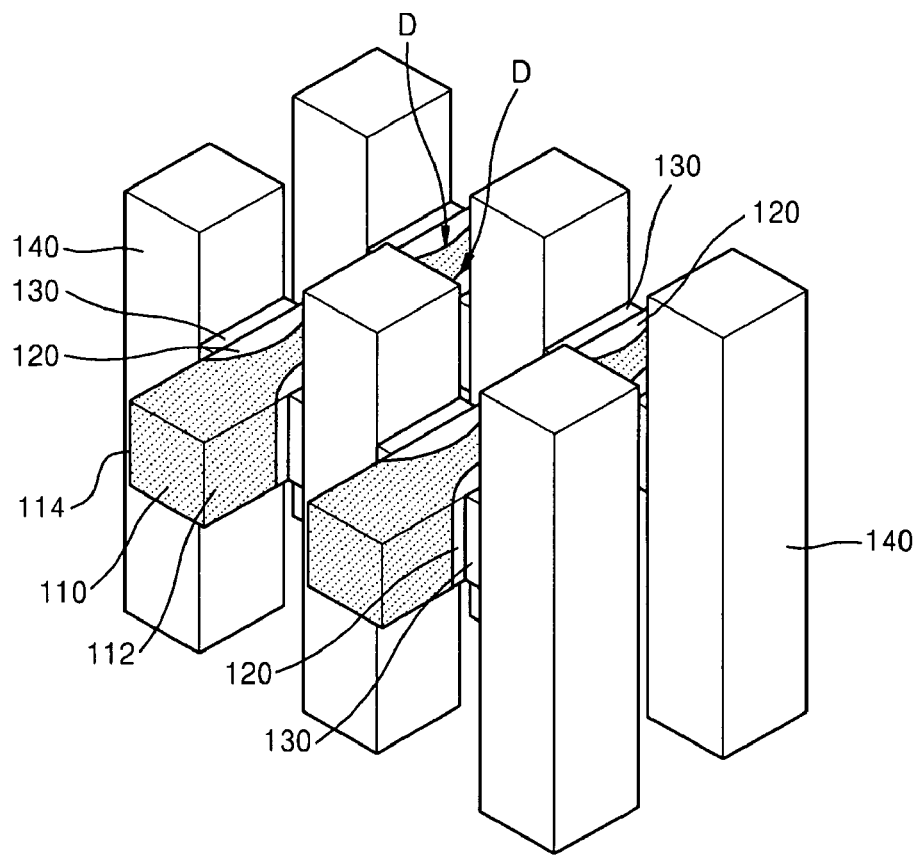

FIG. 4 is a perspective view of a non-volatile memory device according to example embodiments. The non-volatile memory device according to example embodiments may have the array structure of the non-volatile memory device of FIG. 3. The descriptions given with reference to FIGS. 1 through 3 may be applied to the non-volatile memory device according to example embodiments illustrated in FIG. 4. The non-volatile memory device according to example embodiments illustrated in FIG. 4 will not be described here to avoid repetition.

Referring to FIG. 4, a plurality of first electrodes 110 may be disposed on the same plane, and a plurality of second electrodes 140 may be disposed so as to cross the first electrodes 110. For example, a plurality of pairs of second electrodes 140 may be disposed on both sides of the first electrodes 110, wherein the pair of second electrodes 140 may be spaced apart from each other in a direction parallel to a direction in which the first electrode 110 extends. Memory cells of both sides of the second electrodes 140 may share the second electrodes 140 between the first electrodes 110.

A plurality of data storage layers 130 may be interposed between the first electrodes 110 and the second electrodes 140. A plurality of junction diodes D may be disposed inside the first electrodes 110 so as to be connected to the data storage layers 130. For example, a plurality of pairs of junction diodes D may each be disposed on a first surface 112 and a second surface 114 of the first electrode 110.

Figure 5:
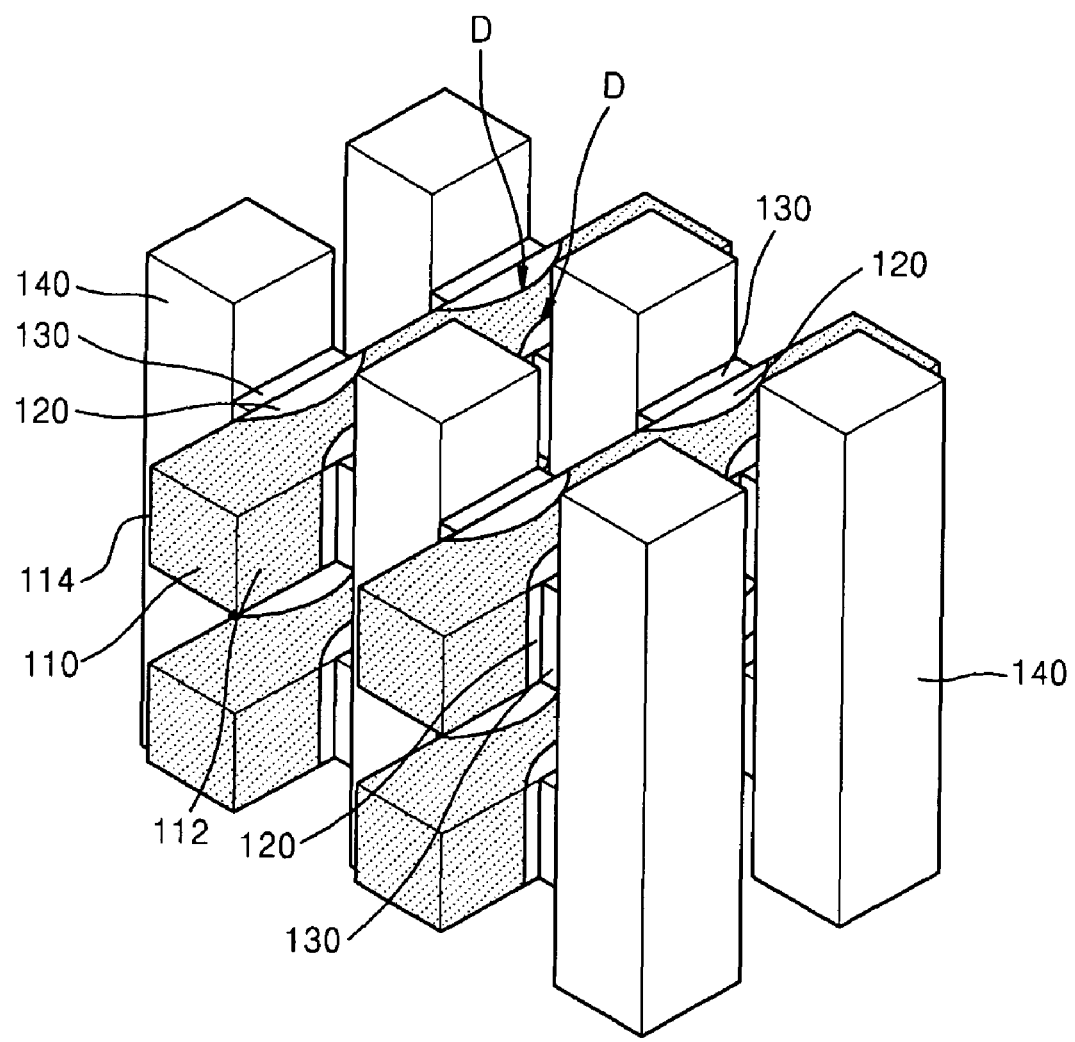

FIG. 5 is a perspective view of a non-volatile memory device according to example embodiments. The non-volatile memory device according to example embodiments illustrated in FIG. 5 may have the stacked structure of the non-volatile memory device of FIG. 4. The descriptions given with reference to FIGS. 1-4 may be applied to the non-volatile memory device according to example embodiments illustrated in FIG. 5. The non-volatile memory device according to example embodiments illustrated in FIG. 5 will not be described here to avoid repetition.

Referring to FIG. 5, a plurality of first electrodes 110 may be stacked in a plurality of layers. A plurality of second electrodes 140 may cross the first electrodes 110 that are stacked so as to be perpendicular to the stacked first electrodes 110. For example, a plurality of pairs of second electrodes 140 may be disposed on both sides of the first electrodes 110, wherein the pair of second electrodes 140 may be spaced apart from each other in a direction parallel to a direction in which the first electrode 110 extends. The second electrodes 140 may extend across the first electrodes 110 so that memory cells disposed across the first electrodes 110 may share the second electrodes 140. For example, the first electrodes 110 and the second electrodes 140 may be disposed to be perpendicular to each other.

A plurality of data storage layers 130 may be interposed at the intersection between the first electrode 110 and the second electrode 140. A plurality of junction diodes D may be disposed inside the first electrode 110 so as to be connected to the data storage layers 130. For example, a plurality of pairs of junction diodes D may each be disposed on a first surface 112 and a second surface 114 of each of the first electrodes 110.

In the non-volatile memory device according to example embodiments illustrated in FIG. 5, a plurality of memory cells may be configured in a three-dimensional structure. The number of memory cells may be easily varied by appropriately varying the numbers and lengths of the first electrodes 110 and the second electrodes 140. Thus, the non-volatile memory device may be advantageous for increased integration, and accordingly may be suitable for high-capacity products.

Figure 6:
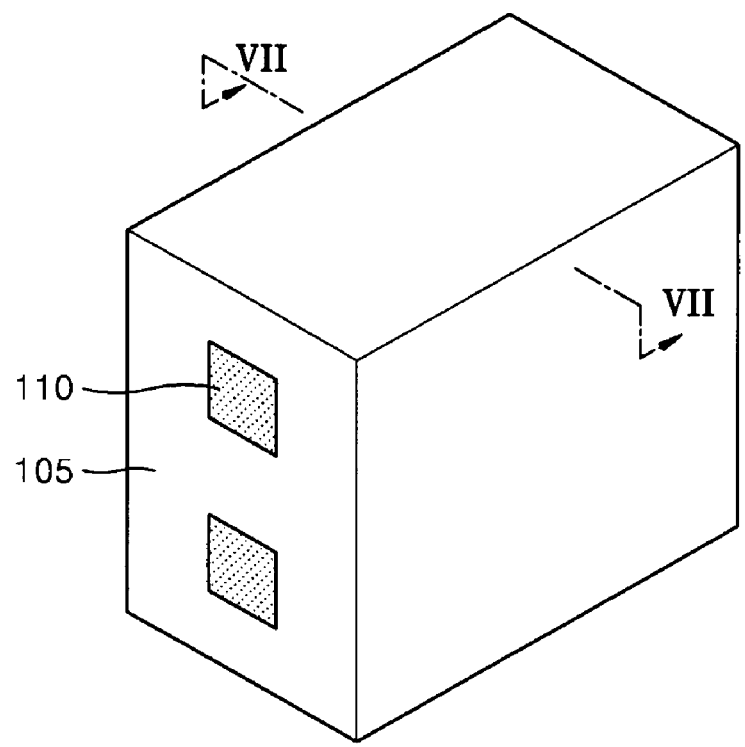
Figure 7:
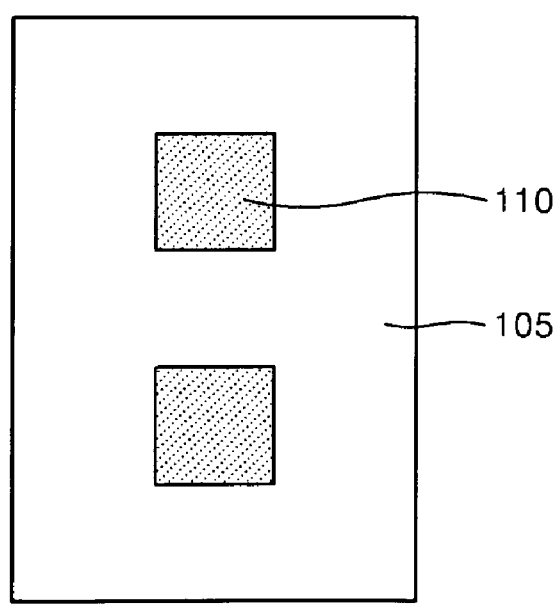

FIGS. 6-13 are perspective views for explaining a method of fabricating a non-volatile memory device according to example embodiments. Referring to FIGS. 6 and 7, a plurality of first electrodes 110 may be configured in a stack structure. For example, the first electrode 110 may include a semiconductor having the first conductive type. The number of the first electrodes 110 may be appropriately varied according to the capacity of non-volatile memory device, and thus, example embodiments may not be limited thereto. Thus, a single first electrode or a plurality of first electrodes may be provided.

The first electrodes 110 may be spaced apart from each other by an insulating layer 105, and may be surrounded by the insulating layer 105. The insulating layer 105 may be illustrated as a single layer, but example embodiments may not be limited thereto. Thus, the insulating layer 105 may include a stack structure formed of various insulating materials. For example, the structure illustrated in FIG. 6 may be formed by alternately stacking a plurality of insulating layers (not shown) and the first electrodes 110, patterning the insulating layers and the first electrodes 110 to form patterns thereon, and then filling the patterns with a second insulating layer (not shown).

Figure 8:
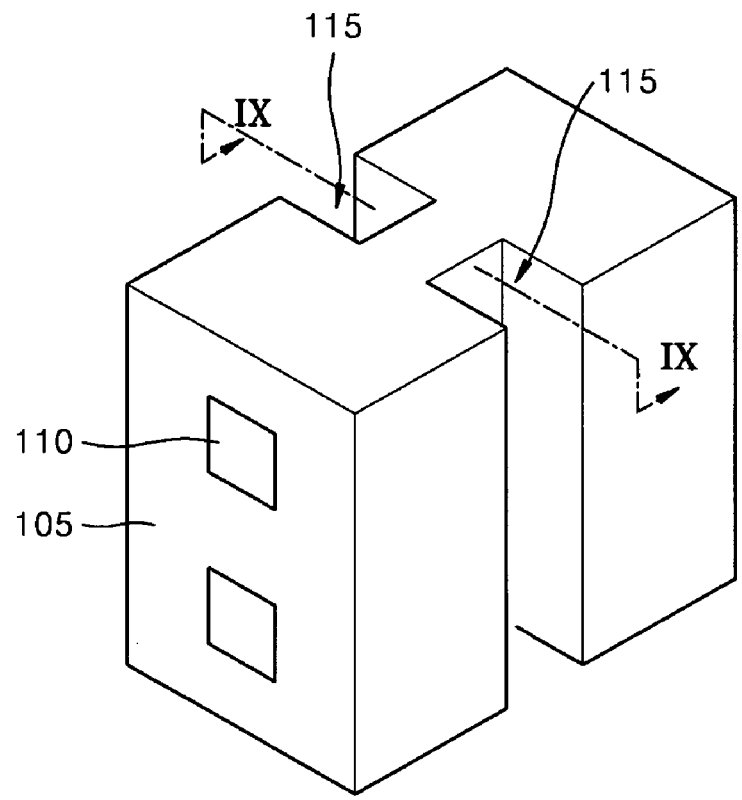
Figure 9:
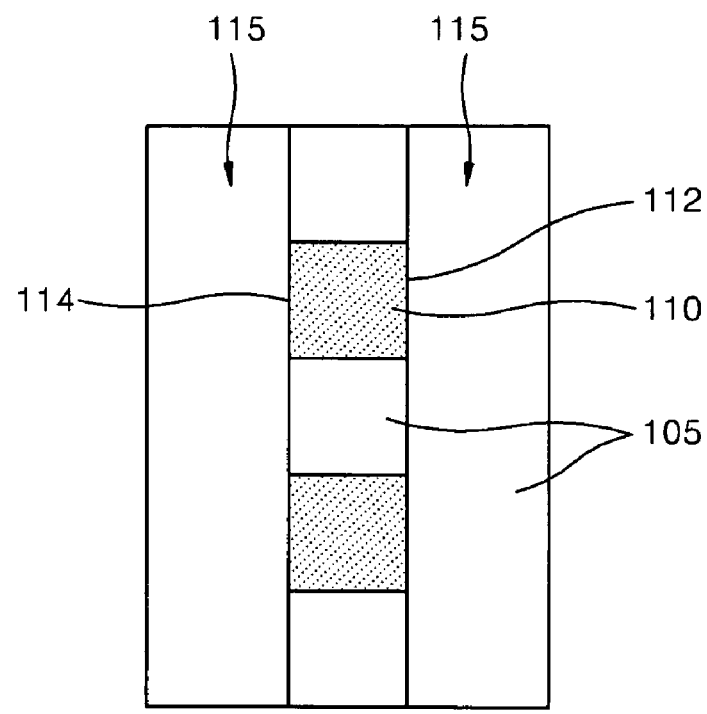
Figure 10:
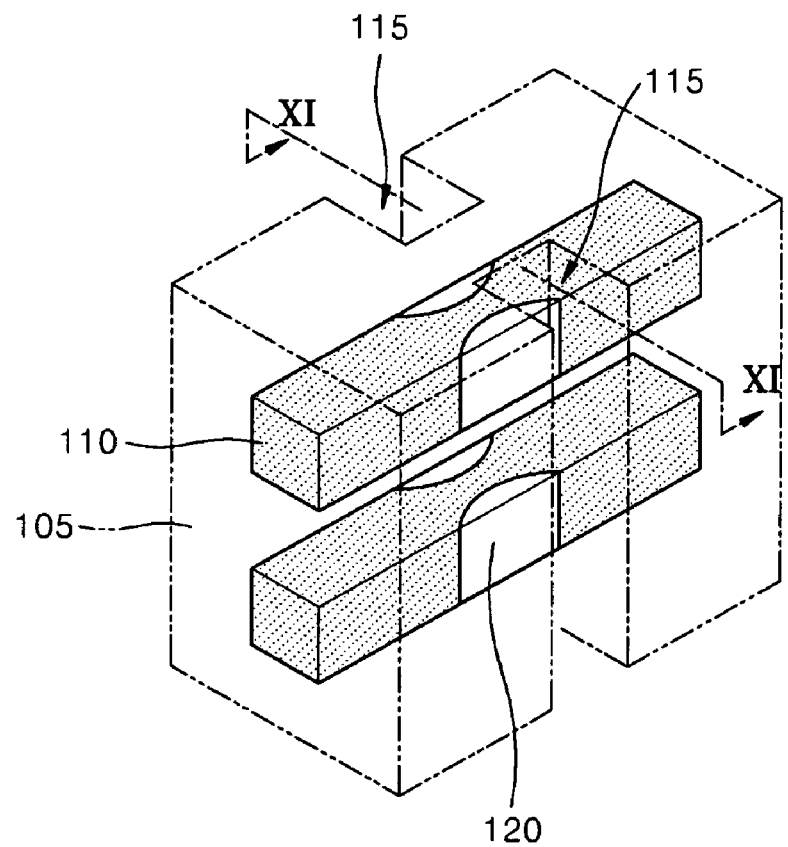
Figure 11:
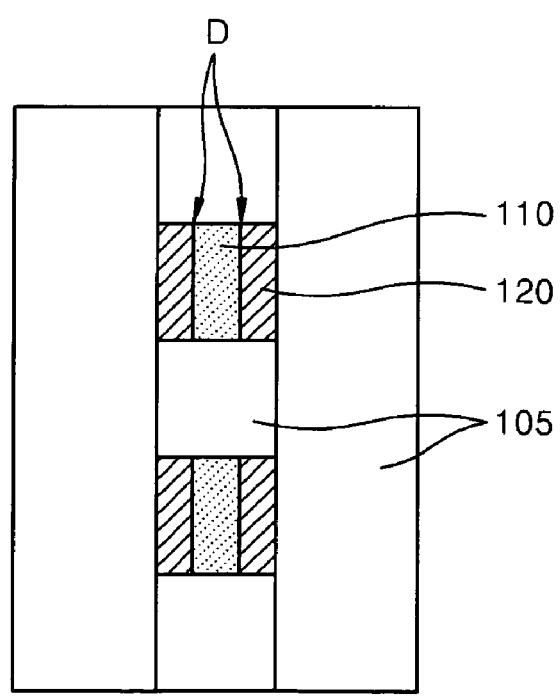

Referring to FIGS. 8 and 9, holes 115 may be formed in the insulating layer 105 so as to expose a first surface 112 and/or a second surface 114 of the first electrode 110. For example, the holes 115 may be formed by photolithography and etching. Referring to FIGS. 10 and 11, the junction diodes D may be formed by forming doped regions 120 in the first electrodes 110. The number of the junction diodes D may be appropriately varied according to the capacity of non-volatile memory device, but example embodiments may not be limited thereto. For example, the junction diodes D may be selectively formed on the first surface 112 or the second surface 114, or alternatively, may be simultaneously formed on the first surface 112 and the second surface 114.

For example, the doped regions 120 may be formed by implanting second conductive impurities into portions of the first surface 112 and/or the second surface 114, which are exposed on the holes 115, by tilt ion implantation. A tilt angle may be selected from among about 0—about 90 degrees, for example, about 20—about 50 degrees, with respect to a bottom surface. When the doped regions 120 are formed on both of the first surfaces 112 and the second surfaces 144, ions may be implanted several times while changing the sign of the tilt angle.

Figure 12:
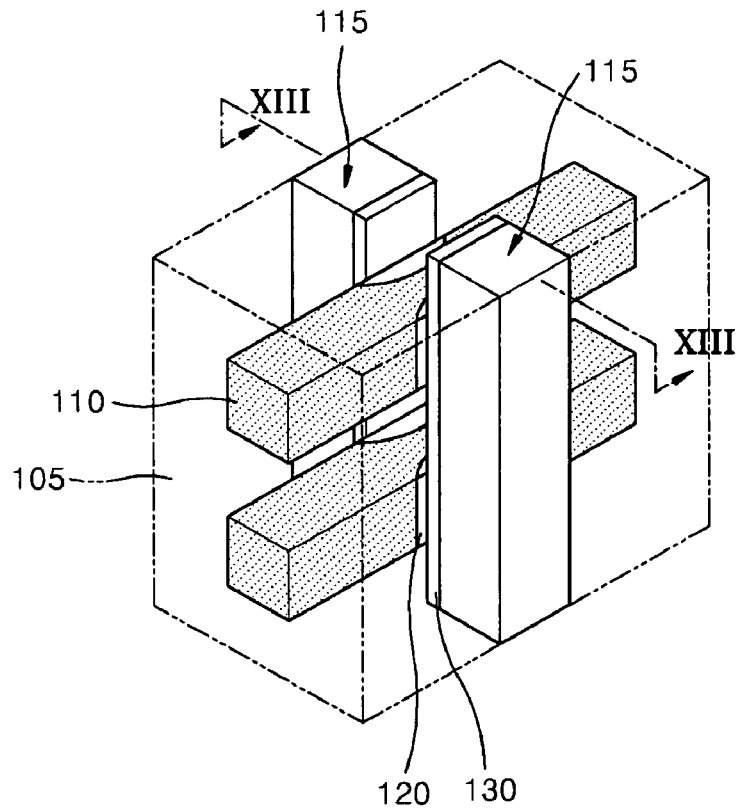
Figure 13:
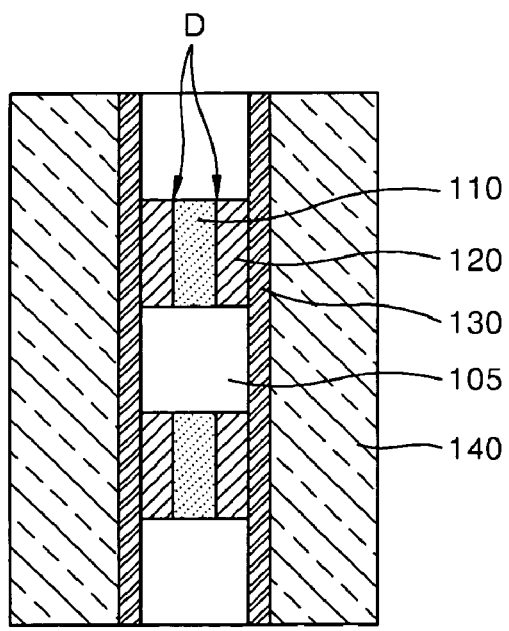

Referring to FIGS. 12 and 13, a plurality of data storage layers 130 may be formed on the first surfaces 112 and/or the second surfaces 114 so as to be connected to the junction diodes D. The data storage layer 130 may be illustrated as a layer extending on the first surface 112 and the second surface 114 in a vertical direction. However, the data storage layer 130 may be selectively formed only on the first surface 112 and the second surface 114, as illustrated in FIG. 5.

A second electrode 140 may be formed on the data storage layer 130. The number of second electrodes 140 may be varied according to the capacity of the non-volatile memory device, but example embodiments may not be limited thereto. For example, the second electrode 140 may be provided only on a single side of the first electrode 110. Alternatively, a pair of second electrodes 140 may be provided on both sides of the first electrodes 110. For example, the second electrodes 140 may be formed so as to fill the holes 115. Thus, the data storage layer 130 may be interposed between the first electrode 110 and the second electrode 140, which cross each other. According to the method described with reference to FIGS. 6 through 13, a stacked structure of non-volatile memory device may be simultaneously and economically fabricated.

Figure 14:
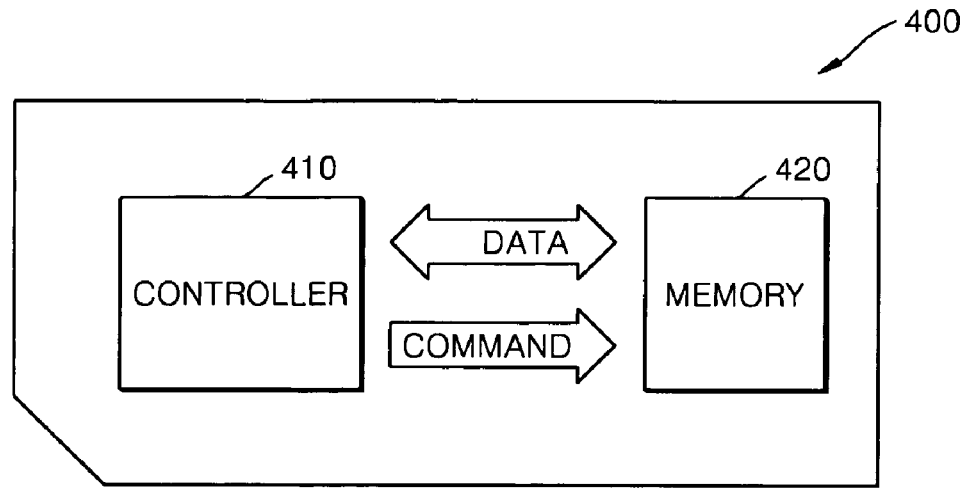

FIG. 14 is a block diagram of a card 400 according to example embodiments. Referring to FIG. 14, a controller 410 and a memory 420 may be arranged so that the controller 410 and the memory 420 may exchange electrical signals. For example, the memory 420 and the controller 410 may exchange data according to a command of the controller 410. Accordingly, the card 400 may store data in the memory 420 or may output data from the memory 420 to an external element. The memory 420 may include at least one of the non-volatile memory devices of FIGS. 1-11. The card 400 may be used in a portable electrical apparatus, e.g., a multimedia card (MMC) or a secure digital card (SD).

Figure 15:
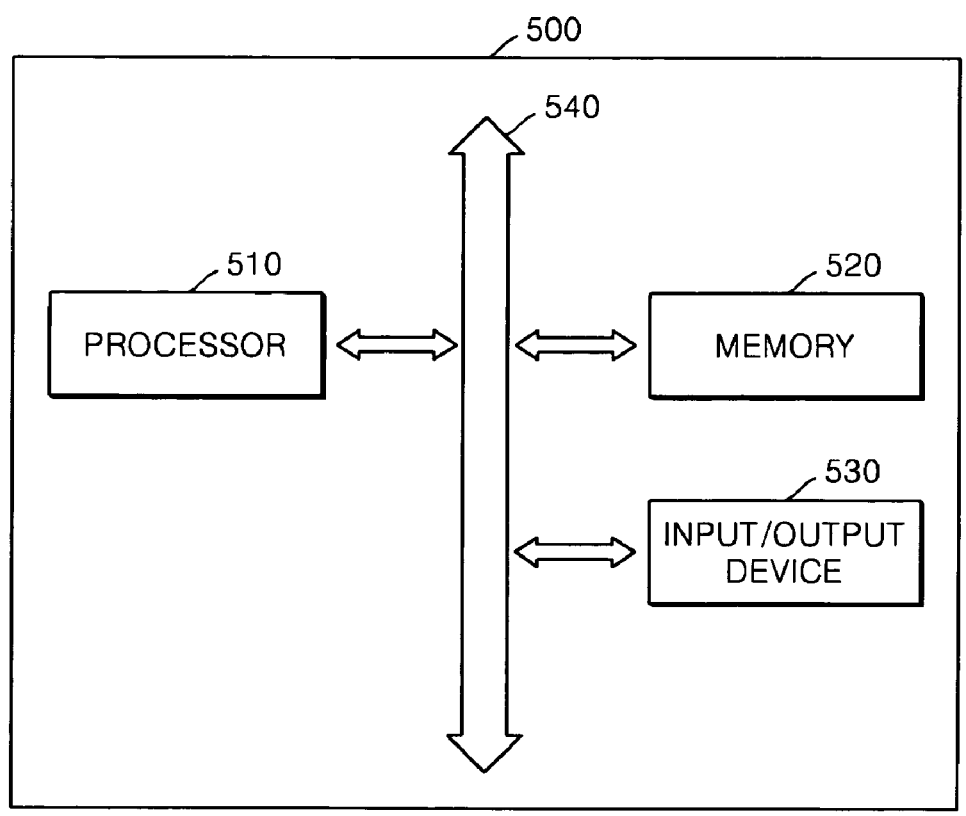

FIG. 15 is a block diagram of a system 500 according to example embodiments. Referring to FIG. 15, a processor 510, an input/output device 530 and a memory 520 may perform data communication using a bus 540. The processor 510 may execute a program and may control a system 500. The input/output device 530 may be used to input or output data of the system 500. The system 500 may be connected to an external device, for example, a personal computer (PC) or a network, so as to exchange data with the external device by using the input/output device 530.

The memory 520 may store a code and data for the operation of the processor 510. The memory 420 may include a memory device that may include at least one of the non-volatile memory devices of FIGS. 1-11. For example, the system 500 may be used in a mobile device, for example, a mobile phone, a MP3 player, a navigation, a solid state disk (SSD), or in other household appliances.

While example embodiments have been particularly shown and described with reference to example embodiments thereof, it will be understood by one of ordinary skill in the art that various changes in form and details may be made therein without departing from the spirit and scope of the following claims.

What is claimed is:

1. A non-volatile memory device comprising:
at least one first electrode; at least two second electrodes crossing the at least one first electrode; and at least one data storage layer at an intersection between the at least one first electrode and the at least two second electrodes, wherein any one of the at least one first electrode and the at least two second electrodes includes at least one junction diode connected to the at least one data storage layer, and the at least two second electrodes are on both sides of the at least one first electrode.

2. The non-volatile memory device of claim 1, wherein the at least one first electrode includes a semiconductor of a first conductive type, and
wherein the at least one junction diode includes a junction structure between the semiconductor and a doped region of a second conductive type opposite to the first conductive type, wherein the doped region is in the semiconductor.

3. The non-volatile memory device of claim 2, wherein the at least one junction diode is inside the at least one first electrode so as to be integrated to the at least one first electrode as one body.

4. The non-volatile memory device of claim 1, wherein the at least one first electrode includes a semiconductor of a first conductive type, and
wherein the at least two second electrodes includes a conductor.

5. The non-volatile memory device of claim 1, wherein the at least one first electrode includes a semiconductor of a first conductive type, and
wherein the at least two second electrodes includes a semiconductor of a second conductive type opposite to the first conductive type.

6. The non-volatile memory device of claim 1, wherein the at least one first electrode and at least two second electrodes cross each other so as to be perpendicular to each other.

7. The non-volatile memory device of claim 1, wherein the data storage layer includes a material which stores the resistance variation of the storage layer.

8. The non-volatile memory device of claim 1, wherein the at least one first electrode includes a first surface and a second surface facing the at least two pair of second electrodes, and
wherein the at least one junction diode includes at least one pair of junction diodes on the first surface and the second surface.

9. The non-volatile memory device of claim 8, wherein the at least one pair of junction diodes includes a plurality of pairs of junction diodes in a direction parallel to a direction in which the at least one first electrode extends.

10. The non-volatile memory device of claim 8, wherein the at least one first electrode includes a plurality of first electrodes stacked in a plurality of layers, and
wherein the at least one pair of junction diodes includes a plurality of pairs of junction diodes on the first surface and the second surface of the plurality of first electrodes.

11. The non-volatile memory device of claim 1, wherein the at least one first electrode includes a plurality of first electrodes,
wherein the at least two second electrodes includes a plurality of second electrodes, and
wherein the at least one junction diodes includes a plurality of junction diodes between the plurality of first electrodes and the plurality of second electrodes.

12. A method of fabricating a non-volatile memory device, the method comprising:
forming at least one first electrode;
forming at least one junction diode in the at least one first electrode;
forming at least one data storage layer so as to be connected to the at least one junction diode; and
forming at least two second electrodes crossing the at least one first electrode,
wherein the at least one data storage layer is at an intersection between the at least one first electrode and the at least two second electrodes, and forming the at least two second electrodes includes forming the at least two second electrodes on both sides of the at least one first electrode.

13. The method of claim 12, wherein forming the at least one first electrode includes forming a semiconductor of a first conductive type,
wherein forming the at least one junction diode includes forming at least one doped region of a second conductive type opposite to the first conductive type in the semiconductor.

14. The method of claim 13, wherein forming the at least one doped region includes selectively implanting impurities of the second conductive type into the semiconductor.

15. The method of claim 12, wherein forming the at least one first electrode includes forming a first surface and a second surface facing the at least two second electrodes, and
wherein forming the at least one junction diode includes forming at least one pair of junction diodes on the first surface and the second surface.

16. The method of claim 15, wherein the at least one pair of junction diodes are formed by tilt ion implantation.

17. The method of claim 16, prior to forming the at least one pair of junction diodes, further comprising:
forming an insulating layer surrounding the at least one first electrode; and
exposing the first surface and the second surface in the insulating layer by forming holes,
wherein the at least two second electrodes are formed so as to fill the holes.

18. The method of claim 15, wherein forming the at least one first electrode includes forming a plurality of first electrodes stacked in a plurality of layers, and
wherein forming the at least one pair of junction diodes includes forming a plurality of pairs of junction diodes on the first surface and the second surface of the plurality of first electrodes.

* * * * *